(12) United States Patent
Demma

(10) Patent No.: US 8,704,109 B2
(45) Date of Patent: Apr. 22, 2014

(54) CARRIER FOR A CONTROL UNIT OF A MOTOR VEHICLE, CONTROL UNIT AND MOTOR VEHICLE

(75) Inventor: Dino Demma, Ruesselsheim (DE)

(73) Assignee: GM Global Technology Operations LLC, Detroit, MI (US)

( * ) Notice: Subject to any disclaimer, the term of this patent is extended or adjusted under 35 U.S.C. 154(b) by 265 days.

(21) Appl. No.: 13/210,963

(22) Filed: Aug. 16, 2011

(65) Prior Publication Data

US 2012/0037415 A1    Feb. 16, 2012

(30) Foreign Application Priority Data

Aug. 16, 2010    (DE) .................... 10 2010 034 520

(51) Int. Cl.
*H05K 7/02* (2006.01)

(52) U.S. Cl.
USPC ........................... 174/541; 439/76.2

(58) Field of Classification Search
USPC ........................... 174/541; 439/76.2
See application file for complete search history.

(56) References Cited

U.S. PATENT DOCUMENTS

| | | | | |
|---|---|---|---|---|
| 5,748,449 | A * | 5/1998 | Tahmassebpur | 361/753 |
| 6,362,971 | B1 | 3/2002 | Skofljanec | |
| 6,541,700 | B2 * | 4/2003 | Chiriku et al. | 174/50 |
| 6,619,995 | B1 | 9/2003 | Hayashi et al. | |
| 7,153,145 | B2 * | 12/2006 | Sekido | 439/76.2 |
| 2002/0197893 | A1 * | 12/2002 | Hiroyuki et al. | 439/76.2 |
| 2004/0043647 | A1 * | 3/2004 | Takeuchi | 439/76.2 |
| 2005/0112940 | A1 | 5/2005 | Naganishi | |
| 2007/0117420 | A1 * | 5/2007 | Kinoshita | 439/76.2 |
| 2010/0025067 | A1 | 2/2010 | Nagai et al. | |

FOREIGN PATENT DOCUMENTS

| | | |
|---|---|---|
| DE | 29900972 U1 | 4/1999 |
| DE | 19936206 A1 | 2/2000 |
| DE | 29918914 U1 | 3/2000 |
| DE | 10229048 A1 | 1/2004 |
| DE | 102005028036 B3 | 7/2006 |
| DE | 102005026277 A1 | 12/2006 |
| DE | 102007026460 A1 | 12/2008 |
| DE | 102008032623 A1 | 1/2010 |
| EP | 2075162 A1 | 7/2009 |
| JP | 2008103484 A | 5/2008 |

OTHER PUBLICATIONS

German Patent Office, German Search Report for German Application No. 102010034520.2, dated Jun. 7, 2011.
UK Patent Office, British Search Report dated Dec. 19, 2011 for GB Application No. 1113294.1.

* cited by examiner

*Primary Examiner* — Hung Ngo
(74) *Attorney, Agent, or Firm* — Ingrassia Fisher & Lorenz, P.C.

(57) ABSTRACT

A carrier is provided for a control unit of a motor vehicle. The carrier includes, but is not limited to at least one material section for fastening to the body of a motor vehicle. It is provided that the carrier is designed for receiving at least two control units, which via an insertion region of the carrier can be mounted to the carrier from the same side. A control unit is also provided for installation in a carrier and a motor vehicle is provided with a carrier.

16 Claims, 5 Drawing Sheets

CARRIER FOR A CONTROL UNIT OF A MOTOR VEHICLE, CONTROL UNIT AND MOTOR VEHICLE

CROSS-REFERENCE TO RELATED APPLICATION

This application claims priority to German Patent Application No. 102010034520.2, filed Aug. 16, 2010, which is incorporated herein by reference in its entirety.

TECHNICAL FIELD

The technical field relates to a carrier for a control unit of a motor vehicle. The carrier comprises at least one material section for fastening to the body of a motor vehicle. The technical field furthermore relates to a control unit and to a motor vehicle.

BACKGROUND

Today, electronic systems are being increasingly used in modern motor vehicles. A constituent part of the electronic systems is at least one control unit that has to be accommodated in the motor vehicle. A carrier, particularly carrier housing, which is fastened to the body of the motor vehicle, usually serves for this purpose.

To date, carrier housings have been known in the prior art in which merely a single control unit can be arranged. The carrier housings are usually manufactured from polymer and suitable for being mounted to the lateral front wall or a cross member of the vehicle body. The known carrier housings however have to be usually removed completely in order to be able to get to the housed control unit in the event of a service. The carrier housings are therefore only conditionally usable in locations of the motor vehicle with difficult access.

In view of foregoing, at least one object of providing a carrier for a control unit of a motor vehicle having the features stated at the outset, which can be accommodated in a motor vehicle in a compact manner and also makes possible a mounting and demounting of a control unit without the carrier having to be mounted or demounted for this purpose. Furthermore, a control unit and a motor vehicle are to be proposed which are suitable for the use of such a carrier.

SUMMARY

A carrier for a control unit of a motor vehicle is provided that comprises at least one material section for fastening to the body of a motor vehicle. By means of this, the control unit can be fixed via the carrier to the body of the motor vehicle. The carrier is designed for receiving at least two control units which can be mounted to the carrier from the same side via an insertion region of the carrier.

Through this measure several control units can be accommodated even with very little space being available in or on the motor vehicle. Their mounting and demounting can be carried out in a simple manner even with little space being available. For the carrier according to the invention offers the possibility of being able to provide several control units in a confined installation space only accessible from one side, which for example in the event of a service can be demounted and subsequently re-mounted in a simple manner. Through the several control units that can be attached to the same carrier cable lengths can be additionally reduced and thus costs and weight saved, particularly since an accommodation of the control units in locations distributed in the space where adequate space just happens to be available, is avoided. Through the several control units that can be received by the carrier, such a compact arrangement is additionally realized that even with confined installation space adequate free space is available in order to be able to accommodate therein for example a utility compartment, particularly a stowage compartment for mobile phones, MP3 players or the like.

At least another advantage of the carrier lies in that the carrier can also be used when, because of the necessary vehicle equipment, merely a part of the control units that can be received by the carrier is required. A variability in the vehicle equipment is thus possible without modifications to the number of carriers installed in or on the vehicle having to be carried out for this.

The carrier is particularly suitable for being used in the region of the pedals of the motor vehicle. Together with the control units, a compact unit of carrier and control units is formed such that the unit can be used with motor vehicle types that are delivered both as left hand drive as well as right hand drive vehicles. The insertion region preferentially is to mean at least one plane with respect to which the insertion direction for the control units to the carrier substantially forms an orthogonal.

According to an embodiment it is provided that the at least one material section forms a contact surface for contacting the body of the motor vehicle, which stands transversely to the insertion region, in particular substantially perpendicularly to the insertion region. Because of this, the control units can be guided to the carrier preferentially with their largest area side substantially parallel to the contact surface or the body region connected to the contact surface and mounted thereon. This access to the control units of the carrier via an insertion region arranged in such a manner thus makes possible the installation and removal of the control units even with a greatly confined installation space.

The carrier can comprise at least one receptacle for at least one of the control units. Preferentially the carrier comprises at least two receptacles for receiving at least one of the control units each. Because of this, a respective control unit can be held in a separate receptacle of the carrier so that the installation and removal of a respective control unit can take place independently of the other control units. It is appropriate that the receptacles are arranged in such a manner that the control units that can be received therein are located next to one another seen in insertion direction. Because of this, the received control units can be directly reached from a same side starting out from the insertion region of the carrier so that a demounting of the individual control unit can be carried out with particularly little effort without changing the position of the other control units. It can also be provided that the receptacles are arranged in such a manner that the control units that can be received therein are located behind one another seen in insertion direction.

It is furthermore appropriate that the receptacles are arranged in such a manner that the adjacent control units received therein is located at a predetermined spacing to one another. Because of this, free space is realized through which the heat generated by the control units can be dissipated so that the formation of soaking heat can be avoided. To cover the free spaces towards the outside, screens can be provided which comprise or several through openings for an air exchange with the surroundings.

According to another embodiment it can be provided that at least one of the receptacles comprises at least one material section through which the receivable control unit can be positively held in the receptacle. Such a positive connection can for example be realized by means of clipping, hooking-in and/or latching the control unit to the receptacle. Furthermore it can be provided that at least one of the receptacles comprises at least one link guide via which one of the control units is displaceably held.

According to another embodiment, it is provided that the carrier comprises at least one slide-in unit into which at least one of the control units can be inserted via an opening of the slide-in unit. Here it is appropriate that the floor of the slide-in unit has a through opening which serves as passage for at least one of the control units. Because of this, a second control unit can be slid in via the opening of the slide-in unit for a first control unit and via the through opening brought into the predefined installation position on the carrier. Insofar the mounting access of the first control unit is also utilized for the second control unit so that for the mounting of the second control unit an additional free mounting space is not necessary. It is appropriate that the through opening has at least the dimension of one of the lateral surfaces of the control unit that can be passed through. Because of this, the control unit can be brought in a particularly simple manner through the through opening in the predefined installation position on the carrier. Preferably, the dimension of the through opening should correspond at least to the dimension of the largest lateral surface of the control unit that can be passed through. Because of this, the installation of the control unit through the through opening is possible with any lateral surface so that the mounting or demounting of the control unit can be carried out particularly easily.

According to another embodiment, it is provided that on the floor of the slide-in unit one of the receptacles for one of the control units is formed. Because of this, the carrier with the at least two receivable control units can be realized in a particularly simple manner and with little expenditure since the slide-in unit for receiving the one control unit is simultaneously utilized also for forming the receptacle for another control unit.

According to a further embodiment, it is provided that the slide-in unit has a lid on which a receptacle for at least one of the control units is formed. This measure, too, aims in the direction that the slide-in unit is utilized as receptacle for an additional one of the control units. With the present embodiment this purpose is served by the lid of the slide-in unit. Preferably, the lid can be removed from the slide-in unit. Because of this, the control unit that can be inserted in the slide-in unit can also be brought into the slide-in unit through that opening which is formed by the removed lid. The lid can for example be releasably arranged on the slide-in unit by means of latching elements. To this end, at least one bow element can be arranged on or molded onto the lid which can be latched relative to a material section of the slide-in unit. In addition, at least one eye can be provided on the lid by means of which the lid can be positioned relative to the slide-in unit.

A control unit is also provided for installation in a carrier of the type described above. A motor vehicle with a carrier of the type described above is also provided, and in addition to the carrier of the type described above the motor vehicle can additionally comprise also at least two control units of the type described above held by the carrier.

BRIEF DESCRIPTION OF THE DRAWINGS

The present invention will hereinafter be described in conjunction with the following drawing figures, wherein like numerals denote like elements, and.

DETAILED DESCRIPTION

The following detailed description is merely exemplary in nature and is not intended to limit application and uses. Furthermore, there is no intention to be bound by any theory presented in the preceding background or summary or the following detailed description.

Figure 1:
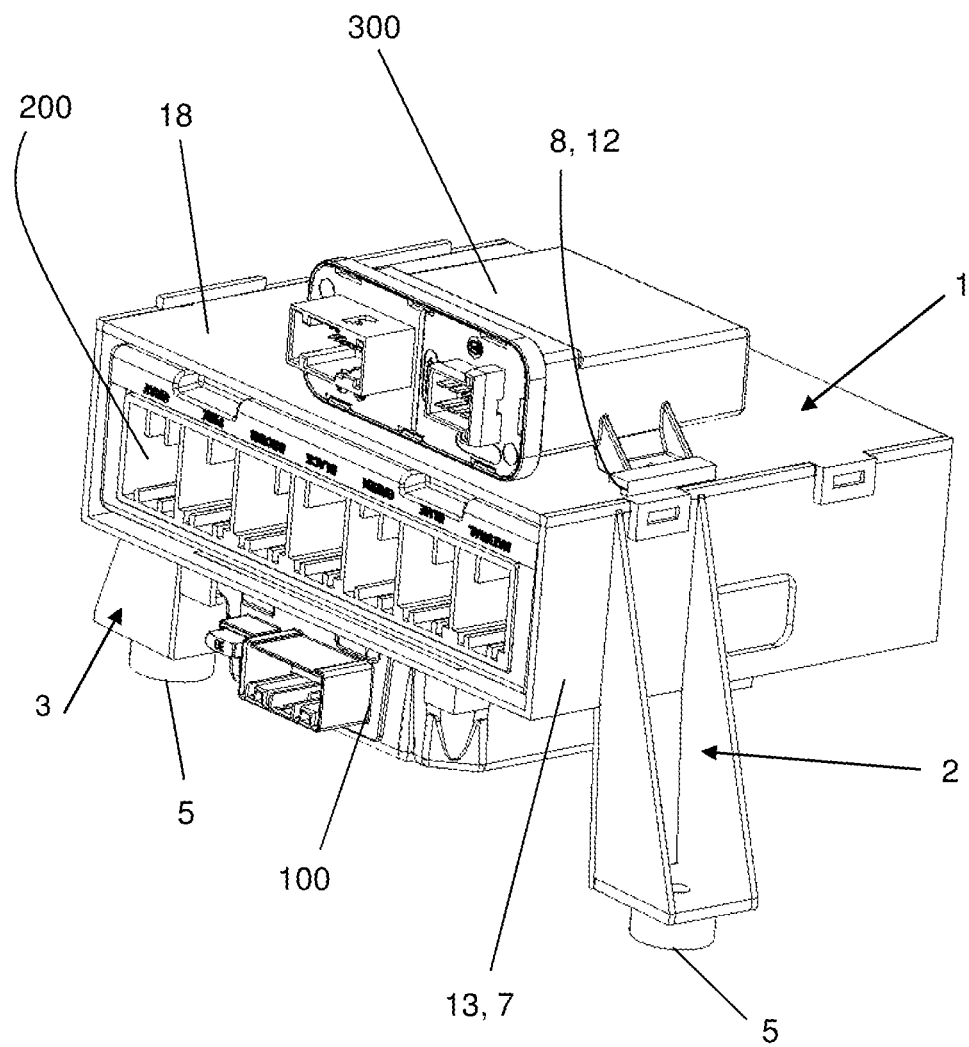
FIG. 1 is a possible embodiment of a carrier for a control unit of a motor vehicle with three control units received therein in perspective representation.
Figure 2:
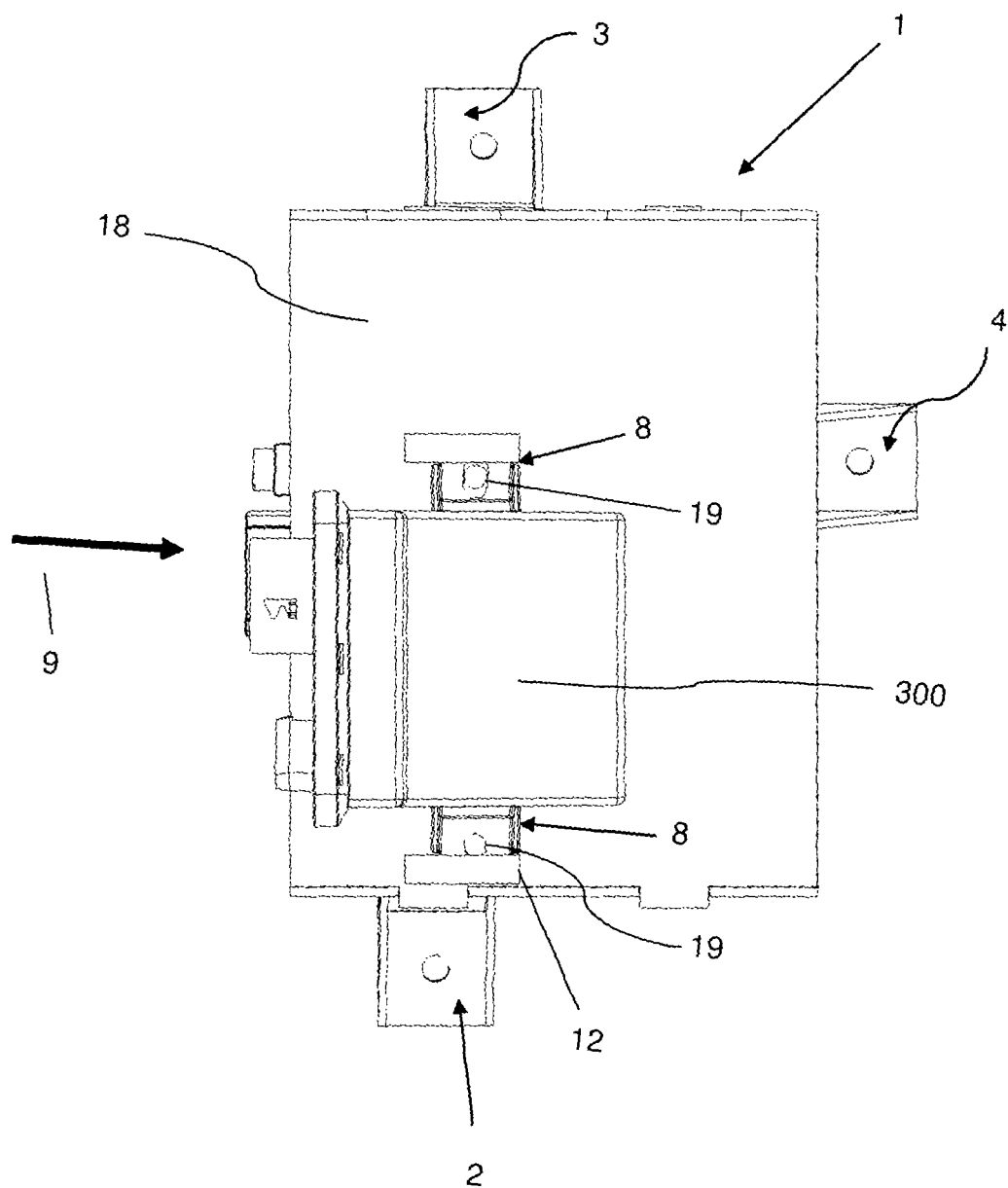
FIG. 2 is the carrier according to FIG. 1 in a top view.

FIG. 1 and FIG. 2. Show, schematic representation, a carrier 1 for a control unit of a motor vehicle in different views. The carrier 1 is designed in order to receive three control units 100, 200, 300 in order to be able to fasten these to the body of the motor vehicle (not shown) by means of the carrier 1.

For receiving the control unit 100, 200, 300 the carrier 1 has a receptacle 6, 7, 8 each. For the control units 200 and 300 the associated receptacles 7, 8 can be seen from FIG. 1 and FIG. 2. The receptacle 6 provided for the control unit 100 can be seen particularly from FIG. 4, which shows the carrier 1 in an exploded representation. The receptacles 6, 7 and 8 are designed in the manner that the control units 100, 200 and 300 can be mounted to the carrier 1 from the same side. The insertion direction of the control units 100, 200, 300 to the carrier 1 is marked in FIG. 2 by the arrow with the referenced number 9. The control units 100, 200, 300 can all three be guided to the carrier 1 in the direction according to the arrow 9 and can also be demounted from the carrier 1 again in the opposite direction.

For fixing to the body of a motor vehicle (not shown) the carrier 1 comprises three material sections 2, 3, 4 which are preferentially designed in the manner of a foot. The material sections 2, 3, 4 are preferably arranged on one of the receptacles, namely the receptacle 7 for the control unit 200, preferentially molded on. The material sections 2, 3, 4 have a contact surface 5 for contacting the body of the motor vehicle (not shown), through which the control units 100, 200, 300 lie with their largest surface side substantially offset parallel to the body of the motor vehicle (not shown). The control units 100, 200, 300 can thus be brought relatively close up against the body of the motor vehicle (not shown) through the one common carrier 1, so that the unit of the carrier 1 and the control units 100, 200, 300 can be optimally accommodated even in a relatively confined installation space.

Through the mounting of the control units 100, 200, 300 in the same insertion direction 9 the control units 100, 200, 300 can be mounted to the carrier 1 from the same side, so that with the unit of the carrier 1 and the control units 100, 200, 300 an exchange of the control units 100, 200 and 300 respectively, for example in the event of a service, can also be carried out without problems even with confined installation space. As is particularly evident from FIG. 1, the receptacle 7 for the control unit 200 is designed as slide-in unit 13.

The receptacles 6 and 8 are arranged relative to the receptacle 7 and the slide-in unit 13 respectively in such a manner that the control units 100, 200, 300 are located next to one another seen in insertion direction 9. Preferably, for this purpose, the receptacle 8 for the control unit 300 is formed on the lid 18, preferentially formed through a link guide 12 on the lid 18. The link guide 12 preferentially comprises two sliding rails molded spaced from each other onto the lid 18, which between them and the lid 18 can receive a section of the control unit 300, so that the control unit 300 can be slid into this in a sliding manner. The link guide 12 in this case is designed in the manner that the control unit 300 can be slid into the receptacle 8 in insertion direction 9. The receptacle 8 preferentially comprises latching means 19, which can be designed as locking means. Through the latching means 19 the control unit 300 is held in the receptacle 8 in the end position in a fixed manner.

Figure 3:
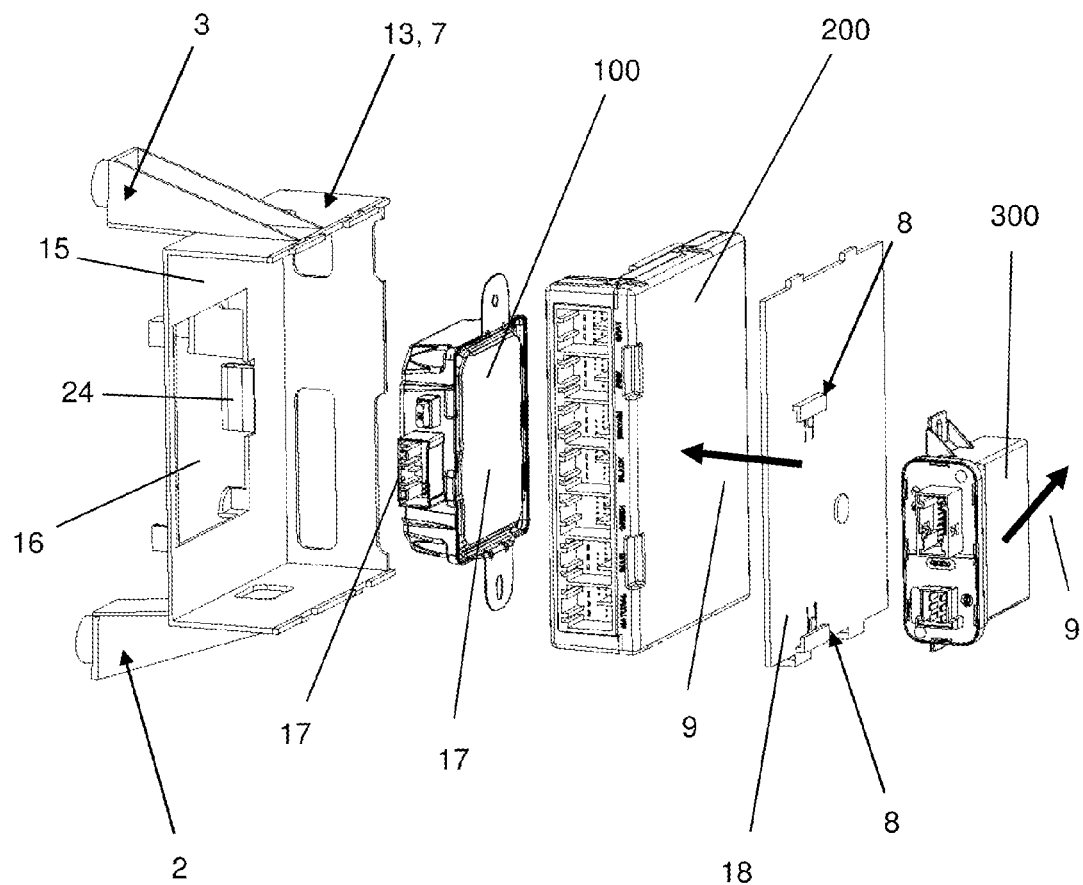
FIG. 3 is the carrier and the control unit according to FIG. 1 in exploded drawing.
Figure 4:
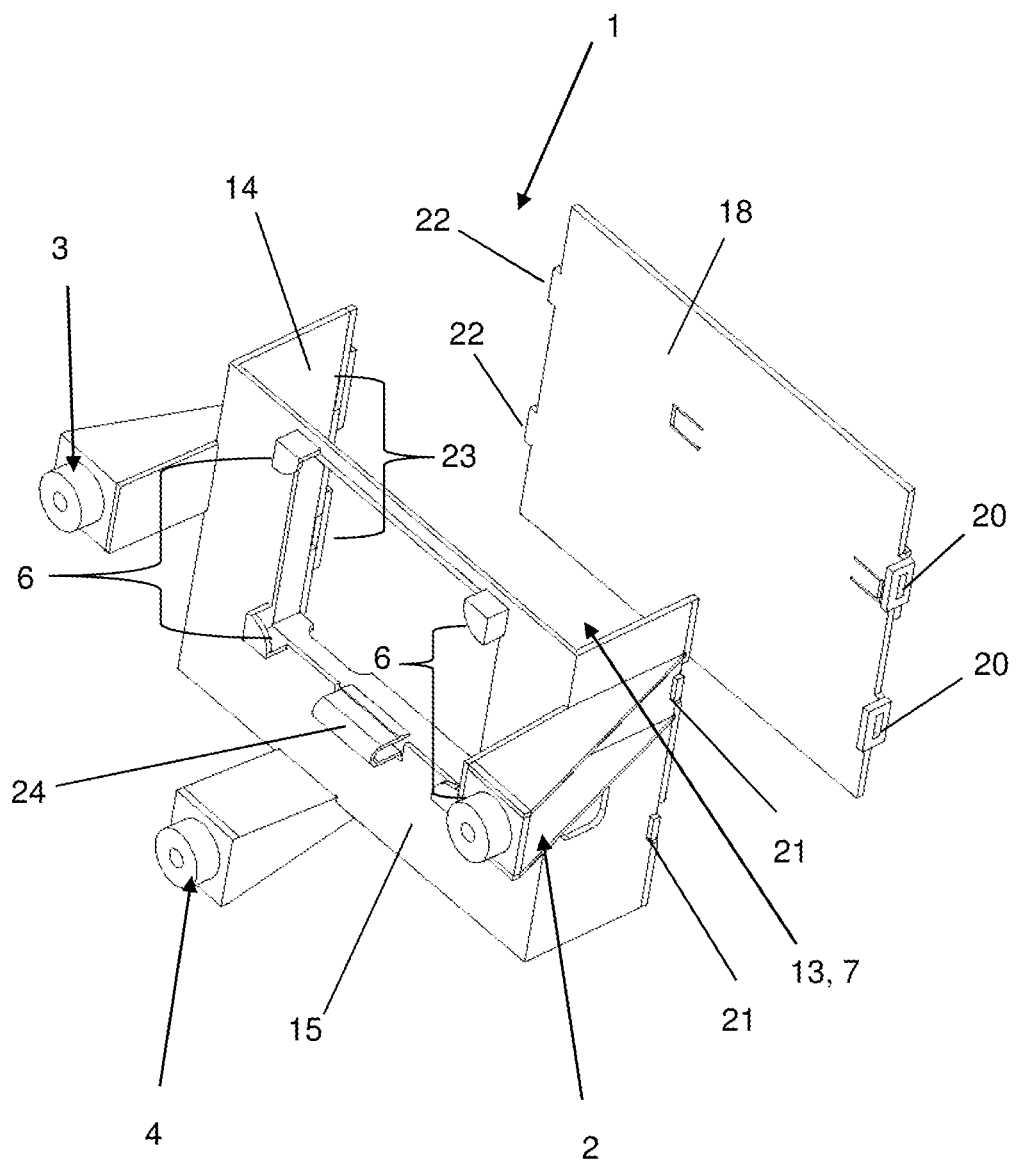
FIG. 4 is the carrier according to FIG. 1 without control units in exploded drawing.

FIG. 3 and FIG. 4 show the carrier 1 alone (FIG. 4) and the carrier 1 together with the control units 100, 200, 300 (FIG. 3) respectively, in each case in an exploded representation. As is evident from this, the lid 18 of the slide-in unit 13 can be removed. The lid 18 to this end comprises a receptacle 20 at its one end, which with at least one projection 21 of the wall of the slide-in unit 13 enters into operational position and brings about a closure of the lid 18 relative to the link guide 12. The receptacle 20 can be designed as bow, which through its course forms a through opening, into which the projection 21 can be inserted.

Preferentially, the lid 18 comprises a positioning means 22 on another side, which can be designed as projection and corresponds to a mating section of the slide-in unit 13, particularly of the side wall of the slide-in unit 13. By inserting the positioning means 22 into a receptacle of the mating section 23 on the slide-in unit 13 the lid 18 is aligned relative to the slide-in unit 13 and can then be latched to the projection 21 in a simple manner by means of the receptacle 20, so that the lid 18 is present on the slide-in unit 13 in a fixed manner. As is additionally evident from FIG. 3 and FIG. 4, the receptacle 6 for the control unit 100 is arranged on the floor 15. The floor 15 of the slide-in unit 13 furthermore comprises a through opening 16, which serves as passage for the control unit 100. The through opening 16 in its dimension is configured in the manner that it corresponds at least to the dimension of the largest lateral surface 17 of the control unit 100. By means of the through opening 16 the control unit 100 is brought into the receptacle 6 via the slide-in unit 13 and the through opening 16. Because of this, the opening 14 of the slide-in unit 13 can be utilized for mounting the control unit 100 to the carrier 1 in order to introduce the control unit 100 into the carrier 1. On the floor 15 of the slide-in unit 13 at least one locking means 24 is provided in order to lock and thus retain the control unit 100 in the installed position in the receptacle 6. The locking means 24 can be designed as clip element, latch element or the like.

Through the removable lid 18 a further insertion direction as alternative to the insertion direction according to the arrow 9 is obtained, which in FIG. 3 is marked with the arrow 9'. At least the control units 100 and 200 can be inserted in the associated receptacle 6 and 7 respectively via the opening of the slide-in unit 13 formed by the removed lid 18. The receptacle 8 formed on the lid 18 with the embodiment of the carrier 1 according to the FIG. 1 to FIG. 4 is designed for receiving the control unit 300 in insertion direction according to the arrow 9.

According to another embodiment of the carrier 1 the receptacle 8 can obviously also be designed in the manner that the control unit 300 can be inserted in the receptacle 8 in insertion direction according to the arrow 9'. With this embodiment of the carrier, the control units 100, 200 and 300 can be guided towards their associated receptacles 6, 7, 8 in the direction according to the arrow 9'. Through the carrier 1, the mounting of the control units 100, 200, 300 is possible in a simple manner as follows.

In a first step the control unit 100 is slid in insertion direction as per the arrow 9 via the opening 14 of the slide-in unit 13 into the latter and via the through opening 16 on the floor 15 of the slide-in unit 13 brought into the receptacle 6 where it is fixed by means of the locking means 24. In a second step the control unit 200 is slid into the slide-in unit 13 where it is likewise fixed preferentially with fixing means (not shown).

In a third step the control unit 300 is now guided to the carrier 1 along the insertion direction according to the arrow 9 and pushed into the link guide 12 of the receptacle 8 and fixed in the end position in the receptacle 8 by means of the latching means 19. The carrier 1 with its control units 100, 200, 300 already mounted therein is then mounted to the body of a vehicle (not shown) in a further step by means of the material sections 2, 3, 4.

Figure 5:
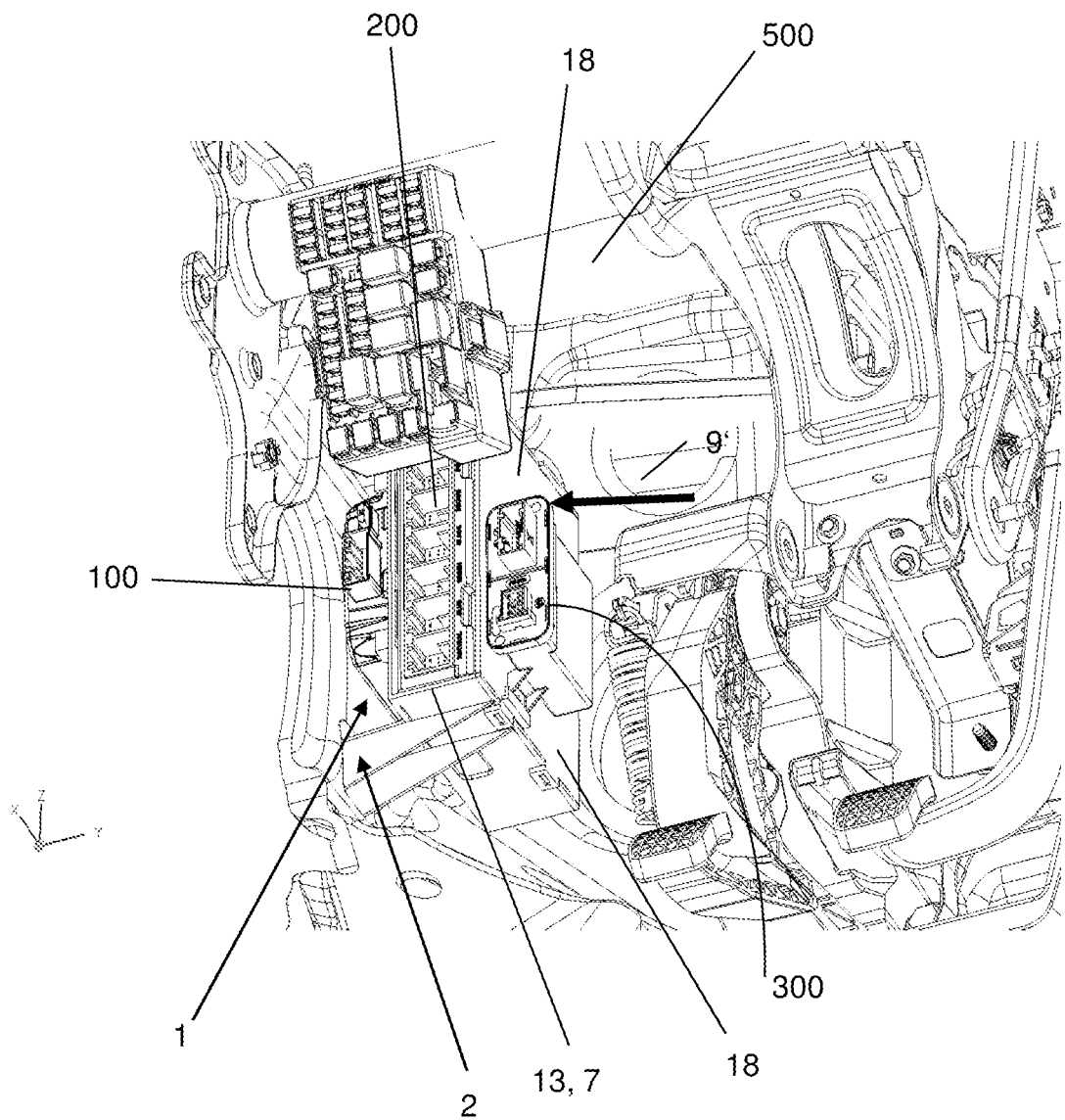
FIG. 5 is the carrier according to FIG. 1 with control units received therein, installed in the interior space of a motor vehicle in the region of the pedals in perspective representation.

FIG. 5 shows the carrier 1 with the control units 100, 200, 300 in an installation example. As is evident from FIG. 5, the carrier 1 is mounted to a side wall of the body on a motor vehicle 500 in the region of the pedals. The carrier 1 in this case is oriented in the passenger compartment in the manner that the insertion direction 9' for the control units 100 and 200 coming from the side of the pedals is freely accessible. Because of this, demounting and remounting of the control units 100, 200 can be carried out without the carrier 1 having to be demounted from the vehicle body. In addition, demounting and remounting of the control unit 300 can take place in a simple manner through demounting and mounting of the lid 18.

According to an alternative method, the lid 18 in a first step is removed from the slide-in unit 13 and via the opening formed thus the control unit 100 in insertion direction according to the arrow 9' is brought into the receptacle 6 via the through opening 16 on the floor 15 of the slide-in unit 13 and preferentially fixed.

In a second step, the control unit 200 is inserted in the slide-in unit 13 according to the arrow 9' via the opening exposed by the lid 18 and the lid 18 subsequently fixed on the slide-in unit 13. Following this, the control unit 300 is slid into the link guide 12 of the receptacle 8 along the insertion direction according to the arrow 9 and in the end position fixed in the receptacle 8 by means of the latching means 19. Alternatively, it can also be provided that the control unit 300 was already mounted in the receptacle 8 to the lid 18 and the lid 18 together with the control unit 300 is then mounted on the slide-in unit 13.

Finally, the carrier 1 with its control units 100, 200 and 300 mounted therein is mounted to the body of the vehicle (not shown). Alternatively, it can also be provided that initially the mounting of the carrier 1 to the body of the vehicle (not shown) is carried out and the mounting of the control units 100, 200, 300 to the carrier is carried out through one of the two procedures described above.

While at least one exemplary embodiment has been presented in the foregoing summary and detailed description, it should be appreciated that a vast number of variations exist. It should also be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing an exemplary embodiment, it being understood that various changes may be made in the function and arrangement of elements described in an exemplary embodiment without departing from the scope as set forth in the appended claims and their legal equivalents.

What is claimed is:

1. A carrier for at least two control units of a motor vehicle, comprising:
   a slide-in unit comprising:
      at least one material section configured to fasten to a body of the motor vehicle;
      a floor;
      a through opening formed in the floor and configured to receive a first control unit; and
      a mounting opening configured to receive a second control unit; and
   a lid to mate with the slide-in unit, and the lid comprising a lid receptacle formed thereon and configured to receive a third control unit.

2. The carrier according to claim 1, wherein the at least one material section forms a contact surface to contact the body of the motor vehicle.

3. The carrier according to claim 1, further comprising at least one receptacle at the slide-in unit for at least one of the at least two control units.

4. The carrier according to claim 3, wherein the at least one receptacle is arranged in such a manner that the at least two control units are located next to one another as seen in insertion direction.

5. The carrier according to claim 3, wherein the at least one receptacle is arranged in such a manner that the at least two control units lay at a predefined spacing from one another.

6. The carrier according to claim 3, wherein the at least one receptacle comprises the at least one material section through which at least one of the at least two control units can be positively held in the at least one receptacle.

7. The carrier according to claim 3, wherein the at least one receptacle comprises at least one link guide into which one of the at least two control units can be slid.

8. A carrier for at least two control units of a motor vehicle, comprising:
   at least one material section configured to fasten to a body of the motor vehicle; and
   a plurality of receptacles to receive the at least two control units for mounting to the carrier, wherein the plurality of receptacles receive the at least two control units in an insertion direction from a common side of the carrier,
   wherein at least one of the plurality of receptacles is a slide-in unit,
   wherein the slide-in unit has an opening in which at least one of the at least two control units can be inserted,
   wherein a floor of the slide-in unit comprises a through opening that is configured to serves as a passage for at least one of the at least two control units.

9. The carrier according to claim 8, wherein the through opening comprises a dimension of at least one lateral surface of the at least two control units that can be passed through.

10. The carrier according to claim 8, wherein the at least one receptacle for one of the at least two control units is formed on the floor of the slide-in unit.

11. The carrier according to claim 8, wherein the slide-in unit comprises a lid on which a receptacle for at least one of the at least two control units is formed.

12. A motor vehicle, comprising:
   a body;
   at least two control units; and
   a carrier for the at least two control units, the carrier comprising:
      at least one material section configured to fasten to the body of the motor vehicle; and
      a plurality of receptacles to receive the at least two control units for mounting to the carrier, wherein the plurality of receptacles receive the at least two control units in an insertion direction from a common side of the carrier,
      wherein one of the plurality of receptacles is a slide-in unit,
      wherein a floor of the slide-in unit comprises a through opening that is configured to serves as a passage for at least one of the at least two control units.

13. The motor vehicle according to claim 12, further comprising the at least one material section that forms a contact surface that is configured to contacting the body of the motor vehicle.

14. The motor vehicle according to claim 12, wherein the at least one receptacle is arranged in such a manner that the at least two control units are located next to one another as seen in insertion direction.

15. The motor vehicle according to claim 12, wherein the at least one receptacle is arranged in such a manner that the at least two control units lay at a predefined spacing from one another.

16. The motor vehicle according to claim 12, wherein the at least one receptacle comprises the at least one material section through which at least one of the at least two control units can be positively held in the at least one receptacle.

* * * * *